United States Patent [19]

Lindmayer

[11] Patent Number: 4,492,812

[45] Date of Patent: * Jan. 8, 1985

[54] ELECTRICAL CONTACTS FOR A SOLAR CELL

[75] Inventor: Joseph Lindmayer, Potomac, Md.

[73] Assignee: Solarex Corporation, Rockville, Md.

[ * ] Notice: The portion of the term of this patent subsequent to Jul. 5, 2000 has been disclaimed.

[21] Appl. No.: 500,404

[22] Filed: Jun. 2, 1983

Related U.S. Application Data

[63] Continuation-in-part of Ser. No. 281,380, Jul. 8, 1981, Pat. No. 4,392,010, which is a continuation-in-part of Ser. No. 3,945, Jan. 16, 1979, Pat. No. 4,297,391.

[51] Int. Cl.³ ............... H01L 31/04; H01L 31/18
[52] U.S. Cl. ................... 136/256; 29/572; 136/261; 427/34; 427/88; 427/90; 427/423; 357/30; 357/67; 357/71

[58] Field of Search .............. 136/256, 261; 29/572; 427/34, 74, 88-91, 423; 357/30, 67, 71

[56] References Cited

U.S. PATENT DOCUMENTS

| | | | |
|---|---|---|---|
| 4,320,251 | 3/1982 | Narasimhan et al. | 136/256 |
| 4,366,336 | 12/1982 | Donaghey | 136/256 |
| 4,392,010 | 7/1983 | Lindmayer | 136/256 |

*Primary Examiner*—Aaron Weisstuch
*Attorney, Agent, or Firm*—Finnegan, Henderson, Farabow, Garrett & Dunner

[57] ABSTRACT

Electrically conductive contacts containing solderable metals, including tin, silver, copper and nickel, with aluminum are formed on the front and/or back surfaces of a solar cell. They are deposited by spraying the metals onto the cell surfaces, together or as layers, with an aluminum-containing layer in direct contact with the cell surfaces.

24 Claims, No Drawings

ELECTRICAL CONTACTS FOR A SOLAR CELL

This application is a continuation-in-part of my U.S. Pat. No. 4,392,010, issued July 5, 1983 in the name of Joseph Lindmayer and entitled, Photovoltaic Cells Having Contacts and Method of Applying Same, which in turn is a continuation-in-part of my Ser. No. 3,945, filed 1/16/79, now U.S. Pat. No. 4,297,391 issued Oct. 27, 1981 in the name of Joseph Lindmayer and entitled, Method of Applying Electrical Contacts to a Photovoltaic Cell.

The present invention relates in general to photovoltaic cells having electrical contacts on their front and/or back surfaces. More specifically, it relates to a method of forming one or both of those electrical contacts and to the cells so produced.

In the foregoing U.S. Pat. No. 4,392,010 and U.S. Pat. No. 4,297,391, I have described photovoltaic cells that are of a general type well-known in the art. In those cells a host material, e.g., a monocrystalline silicon wafer, has been doped with a suitable impurity so that the doped wafer has p or n characteristics. Thereafter, an impurity of a conductivity type opposite to that of the dopant is diffused or otherwise applied to the doped wafer to form a p-n photovoltaic junction at or closely adjacent to the front, light-receiving surface of the wafer. When light energy impinges on the front, light-receiving surface of the cell, electron-hole pairs are excited in the silicon. Because of the presence of the p-n junction, which term is meant to include both p-n and n-p junctions, electrons will be directed toward one or the other of the major surfaces of the cell, and holes toward the other major surface. In a typical n-p cell, electrons are directed to the front, light-receiving surface of the cell and holes toward the back surface. To make the cell operable it is typically necessary to apply electrical contacts to both the front and back surfaces of the cell so that electrons excited by impingement of light on the silicon or other host material will be conducted away from the cell and, after causing work to be done, back to the cell to complete the circuit.

Many problems associated with the application of an electrically conductive grid to the surface of a photovoltaic cell have been mitigated in accordance with the invention disclosed and claimed in the aforementioned U.S. Pat. No. 4,392,010. In that patent a method is described in which a contact is applied to the surface of a photovoltaic cell by forming particles of electrically conductive material, generally a metal, at a temperature in excess of the alloying temperature of the material and silicon, when silicon is the host material for the cell. The particles are then sprayed to a surface of the cell at a temperature at which they will become adhered to the silicon or other host material from which the cell is formed. Preferably, electrical contact between the silicon and the contact material is accomplished without deep alloying when the contact is being applied to the front surface of the cell. True alloying may take place. However, use of the term, alloying, is not limited to a strict, technical definition of the term but includes adherence at somewhat lower temperatures where the mode of adherence might better be termed, sintering. Such methods of spraying have become commonly known as flame spraying, arc spraying, or plasma spraying. Common to all three forms is the fact that fine particles, atoms, or ions of a metallic material, such as aluminum, are directed toward the work surface, in this case the surface of a solar cell. Consequently, for the purposes of the present invention these forms of spraying will be used synonymously and the disclosure of such spraying in my prior patent is desired to be incorporated by reference herein where requisite.

The aforementioned U.S. Pat. No. 4,392,010 described a problem which is present when aluminum, the material preferred for use for both front and back contacts of the cells therein described, is used. Aluminum is economically priced, and has good electrical characteristics that enable it to serve as a conductor of electricity either for the front, patterned grid of a solar cell or for the back, usually continuous contact layer on the rear, protected surface of the cell. While aluminum meets the basic criteria for a suitable conductor of electricity, it has been found that, as exacerbated when plasma spraying is used to apply aluminum to the surface of the cell, the difference in the coefficients of thermal expansion of aluminum and silicon has resulted in cells being bent or warped to some extent as both the silicon host material and the aluminum contact cool. When the back contact of the cell has been plasma sprayed with aluminum in a continuous layer, such warpage is emphasized. As a result, it has been found desirable to apply the aluminum to the back surface of the solar cell in the form of a pattern rather than a continuous layer, thereby at least to mitigate warpage and bending of the cells during cooling. While warpage will be less evident on the front surface of the cell, where the aluminum contact is applied in the form of a grid rather than a continuous surface, it may be present there as well.

Moreover, when aluminum alone is applied, e.g., to the back surface of the cell, the resulting surface has a grainy characteristic, rather than being smooth. The grainy, almost sandpaper-like surface is resistent to facile attachment of parts such as electrical wiring leads, to the back surface of the cell. The same problem is present, perhaps to a lesser extent, where the grainy texture is on the front grid of the cell, particularly where busbars are to be affixed to collecting fingers of the grid. As a consequence, while the so-formed cells are operable, these deficiencies in the use of aluminum contacts sprayed onto the front and/or back surfaces of the cell have been identified.

The aforementioned problems were overcome by reducing the quantity of aluminum used and incorporating with it a soft soldering metal such as zinc. It was taught that aluminum and zinc could be sprayed onto the surface of a cell in a mixture of constant composition, or that several discrete layers of varying composition could be applied, such that the metallic layer adjacent to the silicon of the cell would be largely or entirely aluminum while the external metallic surface would be largely or entirely zinc or other solderable soft metal.

The foregoing U.S. Pat. No. 4,392,010 indicated that, while zinc appeared to be the most suitable solderable soft metal for use at that time, it was contemplated that tin, lead, copper and silver, among other metals, could be substituted for or used in conjunction with zinc.

I have now ascertained that several other solderable metals and alloys can, in fact, be substituted for zinc, and that some of these other metals offer valuable benefits above and beyond those provided by zinc.

Other metals which I have used successfully in this manner include:

(1) Tin/zinc alloy containing from 20% to 40% zinc.

(2) Nickel.
(3) Copper.
(4) Copper/aluminum alloy containing about 90% copper.
(5) Copper/tin alloy containing about 93% copper
(6) Babbitt metal containing 90% tin, 7 antimony, 3% copper.
(7) Tin.
(8) Tin/silver alloy containing from 1% to 5% silver.
(9) Tin/lead alloys having tin/lead ratios in the range from 60/40 to 63/37.
(10) Tin/lead alloys having tin/lead ratios in the range from 60/40 to 65/35 and containing from 1% to 5% of a third metal selected from the group comprised of silver, antimony, cadmium, and bismuth.

Pure silver would also be applicable, and it would provide the best electrical conductivity, but silver is excessively expensive. Copper conductivity is nearly as good as that of silver, but caution must be exercised in spraying copper, because copper, improperly applied, could cause shunting of the active p-n junction of the solar cell.

Nickel and tin are especially good choices for corrosion resistance, while tin is especially easy to solder. Pure tin wire is very soft and consequently difficult to manipulate in this application, but a small amount of silver added to the tin hardens it sufficiently for easy handling.

The tin/lead alloys, with or without the addition of a third metal, are commercial solders, and they yield products possessing the desirable solderability properties of these solders.

Considering all of the requirements for solar cell metallization, the preferred metal for use with aluminum at this time appears to be a tin alloy containing a small amount of silver. A commercially available alloy which I find especially suitable contains about 96% tin and 3.6 to 4.4% silver.

While the present invention has been described with reference to best modes thereof, numerous alterations and modifications will be apparent to those of skill in the art without departing from the spirit of the invention. As to all such obvious alterations and modifications, it is desired that they be included within the preview of my invention, which is to be limited only by the scope, including equivalents, of the following appended claims.

I claim:

1. A method of applying an electrically conductive contact to the surface of a silicon-containing photovoltaic cell, said method comprising: forming a mixture of aluminum and solderable metal at a temperature in excess of the alloying temperature of said mixture and silicon, said solderable metal consisting essentially of a combination of tin and a minor amount of silver, said combination of tin and silver comprising at least about 10% of said mixture; and spraying said mixture toward said surface at a distance such that said mixture will contact said surface at a temperature at which it will alloy with said silicon and thereby adhere to said surface.

2. A method as claimed in claim 1, in which said combination of tin and silver contains from 1 to 5% silver.

3. A method as claimed in claim 2, in which said combination of tin and silver contains about 96% tin.

4. A method as claimed in claim 3, in which said combination of tin and silver contains from 3.6 to 4.4% silver.

5. A method of applying an electrically conductive contact to the surface of a silicon-containing photovoltaic cell, said method comprising: forming a mixture of aluminum and a solderable metal at a temperature in excess of the alloying temperature of said mixture and silicon, said solderable metal comprising copper and up to 10% aluminum, said solderable metal comprising at least about 10% of said mixture; and spraying said mixture toward said surface at a temperature at which it will alloy with said silicon and thereby adhere to said surface.

6. A method of applying an electrically conductive contact to the surface of a silicon-containing photovoltaic cell, said method comprising: forming a mixture of aluminum and a solderable metal at a temperature in excess of the alloying temperature of said mixture and silicon, said solderable metal comprising copper and up to 7% tin, said solderable metal comprising at least about 10% of said mixture; and spraying said mixture toward said surface at a temperature at which it will alloy with said silicon and thereby adhere to said surface.

7. A method of applying an electrically conductive contact to the surface of a silicon-containing photovoltaic cell, said method comprising; forming a mixture of aluminum and a solderable metal at a temperature in excess of the alloying temperature of said mixture and silicon, said solderable metal comprising tin and further including about 10% of a mixture of antimony and copper, said solderable metal comprising at least about 10% of said first mentioned mixture; and spraying said first mentioned mixture toward said surface at a temperature at which it will alloy with said silicon and thereby adhere to said surface.

8. A method of applying an electrically conductive contact to the surface of a silicon-containing photovoltaic cell, said method comprising: forming a mixture of aluminum and a solderable metal at a temperature in excess of the alloying temperature of said mixture and silicon, said solderable metal consisting essentially of a combination of lead and tin, said combination of lead and tin comprising at least about 10% of said mixture; and spraying said mixture toward said surface at a distance such that said mixture will contact said surface at a temperature at which it will alloy with said silicon and thereby adhere to said surface.

9. A method as claimed in claim 8 in which the ratio of tin to lead is in the range of from 60/40 to 63/37.

10. A method as claimed in claim 8 in which the ratio of tin to lead is in the range of from 60/40 to 65/35 and said combination further includes from 1 to 5% of an additional metal selected from the group consisting of silver, antimony, cadmium, and bismuth.

11. A method of applying an electrically conductive contact to the surface of a silicon-containing photovoltaic cell, said method comprising: forming a mixture of aluminum and a solderable metal at a temperature in excess of the alloying temperature of said mixture and silicon, said solderable metal consisting essentially of a combination of tin and zinc, wherein said combination contains about 20 to 40% zinc, said combination of tin and zinc comprising at least about 10% of said mixture, and spraying said mixture toward said surface at a distance such that said mixture will contact said surface at a temperature at which it will alloy with said silicon and thereby adhere to said surface.

12. A silicon containing photovoltaic cell having a front surface adapted to receive and absorb light impinging thereon and a back surface opposed to said front surface, and an electrical contact covering at least a portion of at least one of said surfaces, said contact being comprised of a layer of a mixture of aluminum and a solderable soft metal, said solderable metal consisting essentially of a combination of tin and a minor amount of silver, said combination of tin and silver comprising at least about 10% of said mixture.

13. A cell as claimed in claim 12, wherein said combination of tin and silver contains from 1 to 5% silver.

14. A cell as claimed in claim 13, wherein said combination of tin and silver contains about 96% tin.

15. A cell as claimed in claim 14, wherein said combination of tin and silver contains from 3.6 to 4.4% silver.

16. A silicon-containing photovoltaic cell having a front surface adapted to receive and absorb light impinging thereon and a back surface opposed to said front surface, and an electrical contact covering at least a portion of at least one of said surfaces, said contact being comprised of a layer of a mixture of aluminum and a solderable soft metal, wherein said solderable metal is copper and further includes up to 7% tin, said solderable metal comprising at least about 10% of said mixture.

17. A silicon-containing photovoltaic cell having a front surface adapted to receive and absorb light impinging thereon and a back surface opposed to said front surface, and an electrical contact covering at least a portion of at least one of said surfaces, said contact being comprised of a layer of a mixture of aluminum and a solderable soft metal, wherein said solderable metal is tin and further includes about 10% of a mixture of antimony and copper, said solderable metal comprising at least about 10% of said first mentioned mixture.

18. A silicon-containing photovoltaic cell having a front surface adapted to receive and absorb light impinging thereon and a back surface opposed to said front surface, and an electrical contact covering at least a portion of at least one of said surfaces, said contact being comprised of a layer of a mixture of aluminum and a solderable soft metal, said solderable metal consisting essentially of a combination of lead and tin, said combination of lead and tin comprising at least about 10% of said mixture.

19. A silicon-containing cell as claimed in claim 18, wherein the ratio of tin to lead is in the range of from 60/40 to 63/37.

20. A cell as claimed in claim 18, wherein the ratio of tin to lead is in the range of from 60/40 to 65/35 and said combination further includes from 1 to 5% of an additional metal selected from the group consisting of silver, antimony, cadmium, and bismuth.

21. A silicon-containing photovoltaic cell having a front surface adapted to receive and absorb light impinging thereon and a back surface opposed to said front surface, and an electrical contact covering at least a portion of at least one of said surfaces, said contact being comprised of a layer of a mixture of aluminum and a solderable soft metal, said solderable metal consisting essentially of a combination of tin and zinc, wherein said combination contains about 20 to 40% zinc, and combination of tin and zinc comprising at least about 10% of said mixture.

22. A cell as claimed in claim 12, 16, 17, or 21, said contact being formed with an overcoat layer including a solderable soft metal overlying and adhered to said layer containing aluminum.

23. A cell as claimed in claim 12, 16, 17, ,18 or 21, in which said contact is comprised of a layer of a mixture of aluminum and at least about 40% of said solderable soft metal.

24. A cell as claimed in claim 12, 16, 17, 18 or 21, in which said contact is comprised of a layer of a mixture of about 50% aluminum and 50% of said solderable soft metal.

* * * * *